(12) United States Patent
Jang et al.

(10) Patent No.: US 8,247,299 B2
(45) Date of Patent: Aug. 21, 2012

(54) FLASH MEMORY DEVICE AND FABRICATION METHOD THEREOF

(75) Inventors: Phil Soon Jang, Goyang-si (KR); Hee Hyun Chang, Seongnam-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 225 days.

(21) Appl. No.: 12/015,411

(22) Filed: Jan. 16, 2008

(65) Prior Publication Data
US 2009/0050952 A1    Feb. 26, 2009

(30) Foreign Application Priority Data

Aug. 20, 2007 (KR) .................. 10-2007-0083342

(51) Int. Cl.
*H01L 21/762* (2006.01)
(52) U.S. Cl. ................. 438/296; 438/257; 257/E21.546
(58) Field of Classification Search .......... 438/257, 438/258, 259, 264, 266, 296; 257/E21.546
See application file for complete search history.

(56) References Cited

U.S. PATENT DOCUMENTS

| | | | | |
|---|---|---|---|---|
| 6,008,091 | A * | 12/1999 | Gregor et al. ................ | 438/261 |
| 6,265,780 | B1 * | 7/2001 | Yew et al. ................... | 257/759 |
| 6,291,855 | B1 * | 9/2001 | Chang et al. ................ | 257/316 |
| 7,309,634 | B2 * | 12/2007 | Hong ........................... | 438/288 |
| 7,575,972 | B2 * | 8/2009 | Dong ........................... | 438/257 |
| 2002/0140031 | A1 * | 10/2002 | Rim .............................. | 257/347 |
| 2003/0199149 | A1 * | 10/2003 | Lee et al. ..................... | 438/424 |
| 2003/0216002 | A1 * | 11/2003 | Lee ............................... | 438/264 |
| 2004/0121534 | A1 * | 6/2004 | Lin et al. ..................... | 438/257 |
| 2004/0126972 | A1 * | 7/2004 | Dong et al. .................. | 438/259 |
| 2004/0140504 | A1 * | 7/2004 | Hsu et al. .................... | 257/341 |
| 2004/0191987 | A1 * | 9/2004 | Park et al. ................... | 438/257 |
| 2005/0002231 | A1 * | 1/2005 | Ozawa et al. ............ | 365/185.01 |
| 2005/0029573 | A1 * | 2/2005 | Sato et al. ................... | 257/314 |
| 2005/0088898 | A1 * | 4/2005 | Hsu et al. .................... | 365/222 |
| 2005/0184327 | A1 * | 8/2005 | Ozawa ......................... | 257/302 |
| 2005/0266638 | A1 * | 12/2005 | Cho et al. .................... | 438/257 |
| 2006/0011968 | A1 * | 1/2006 | Kwon et al. ................ | 257/315 |
| 2006/0128099 | A1 * | 6/2006 | Kim et al. ................... | 438/258 |
| 2006/0138522 | A1 * | 6/2006 | Kim ............................. | 257/315 |
| 2007/0026611 | A1 * | 2/2007 | Saito et al. .................. | 438/261 |
| 2007/0122968 | A1 * | 5/2007 | Sim et al. .................... | 438/243 |
| 2007/0190726 | A1 * | 8/2007 | Song et al. .................. | 438/264 |
| 2007/0218619 | A1 * | 9/2007 | Cha et al. .................... | 438/201 |
| 2007/0231989 | A1 * | 10/2007 | Chung et al. ................ | 438/201 |
| 2008/0064164 | A1 * | 3/2008 | Dong ........................... | 438/257 |

FOREIGN PATENT DOCUMENTS

| | | |
|---|---|---|
| JP | 2006-351881 | 12/2006 |
| KR | 1020020095355 A | 12/2002 |
| KR | 1020030067824 | 8/2003 |
| KR | 1020070054296 | 5/2007 |

* cited by examiner

*Primary Examiner* — Steven Loke
*Assistant Examiner* — Earl Taylor
(74) *Attorney, Agent, or Firm* — Lowe Hauptman Ham & Berner, LLP

(57) ABSTRACT

The present invention relates to a flash memory device and a fabrication method thereof. In an embodiment, a flash memory device includes a tunnel insulating film and a floating gate laminated over an active region of a semiconductor substrate, an isolation layer formed in a field region of the semiconductor substrate and projected higher than the floating gate, a dielectric layer formed over the semiconductor substrate including the floating gate and the isolation layer, and a control gate formed on the dielectric layer.

5 Claims, 2 Drawing Sheets

FLASH MEMORY DEVICE AND FABRICATION METHOD THEREOF

CROSS-REFERENCES TO RELATED APPLICATIONS

The present application claims priority to Korean patent application number 10-2007-83342, filed on Aug. 20, 2007, which is incorporated by reference in its entirety.

BACKGROUND OF THE INVENTION

The present invention relates to a flash memory device and a fabrication method thereof and, more particularly, to a flash memory device wherein an interference phenomenon between floating gates can be improved, and a fabrication method thereof.

A flash memory device is comprised of a floating gate for storing data and a control gate for program, erase and read operations. Specifically, a flash memory device has a structure in which a tunnel insulating film, a floating gate, a dielectric layer and a control gate are laminated over a semiconductor substrate. The tunnel insulating film is generally formed of an oxide film and functions to prohibit electrons, stored in the floating gate, from being drained to the semiconductor substrate. The dielectric layer is formed between the floating gate and the control gate and functions to prohibit electrons, stored in the floating gate, from being drained to the control gate. A capacitance value may be changed depending on the dielectric constant of the dielectric layer. As the capacitance value varies, the coupling ratio is changed.

This flash memory device is a kind of device in which data stored therein is retained even if power is off, and has been in the spotlight as portable devices. In order to realize portability and a large capacity, the flash memory device is gradually miniaturized. To this end, the level of integration of devices has gradually increased.

As devices are highly integrated, a distance between the floating gates is narrowed and accordingly, a high dielectric (high-k) material is used as the dielectric layer. In this case, however, parasitic capacitance between memory cells may be increased due to an increase of the dielectric constant. Due to this, an interference phenomenon between the memory cells is increased, so reliability of devices may be lowered.

BRIEF SUMMARY OF THE INVENTION

The present invention is directed to reducing an interference phenomenon caused by a parasitic capacitor comprised of adjacent floating gates and a dielectric layer between the floating gates formed of by projecting an isolation layer between floating gates so as to be higher than the floating gates, irrespective of the dielectric layer being formed of a high dielectric material.

The present invention is also directed to omitting an Effective Field Height (EFH) control process of the isolation layer, to increasing capacitance between the floating gate and the control gate, and to improving the coupling ratio, by forming the dielectric layer between the floating gate and the control gate using a high-k material.

A flash memory device according to an embodiment of the present invention includes a tunnel insulating film and a floating gate laminated over an active region of a semiconductor substrate; an isolation layer formed in a field region of the semiconductor substrate and configured to project higher than the floating gate; a dielectric layer formed over the semiconductor substrate including the floating gate and the isolation layer; and a control gate formed on the dielectric layer.

The isolation layer is configured to project 300 to 500 angstrom higher than the floating gate. The dielectric layer is formed of a high-k material. The high-k material is formed of any one of $Al_2O_3$, $HfO_3$, $ZrO_3$ and combination thereof.

In a flash memory device according to another embodiment of the present invention, a tunnel insulating film, a first conductive layer, and a hard mask layer are formed over a semiconductor substrate. The hard mask layer, the first conductive layer, and the tunnel insulating film are patterned. A trench is formed in the semiconductor substrate. An isolation layer is formed so that the trench is gap-filled to a height of the hard mask layer. The hard mask layer is then removed. A dielectric layer is formed over the semiconductor substrate including the first conductive layer and the isolation layer. A second conductive layer is formed on the dielectric layer.

The hard mask layer is formed to a thickness of 400 to 500 angstrom. The hard mask layer is formed of a nitride film.

The formation of the isolation layer includes forming an insulating film for an isolation layer so that all of the hard mask layer is covered, and performing a polishing process to remove the insulating film until the hard mask layer is exposed.

A step between the isolation layer and the first conductive layer is in the range of 300 to 500 angstrom. The dielectric layer is formed of a high-k material. The high-k material is formed using any one of $Al_2O_3$, $HfO_3$, $ZrO_3$ and combination thereof.

DESCRIPTION OF SPECIFIC EMBODIMENTS

Now, a specific embodiment according to the present invention will be described with reference to the accompanying drawings.

FIGS. 1A to 1E are sectional views illustrating a method of fabricating a flash memory device according to the present invention.

Figure 1A:
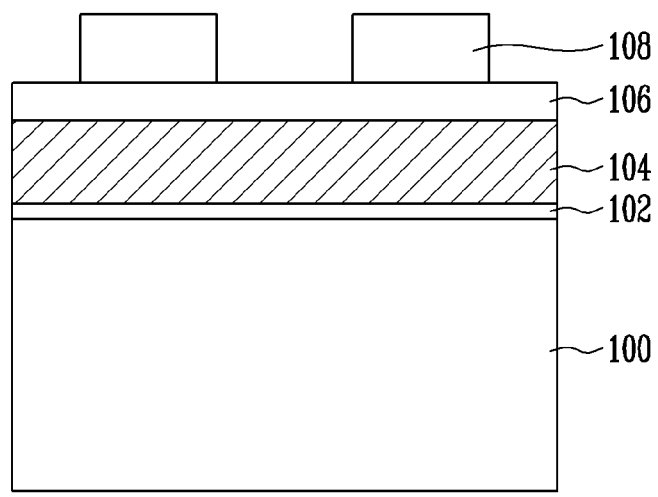
FIGS. 1A to 1E are sectional views illustrating a method of fabricating a flash memory device according to the present invention.

Referring to FIG. 1A, a tunnel insulating film 102, a first conductive layer 104 for a floating gate, a hard mask layer 106 for an etch stop layer and a photoresist pattern 108 are sequentially formed over a semiconductor substrate 100 in which a well (not shown) has been formed and on which an ion implantation process for threshold voltage control has been performed.

The tunnel insulating film 102 may be formed of an oxide film in order to provide an insulating function. The first conductive layer 104 for the floating gate may be formed of an undoped or doped polysilicon layer. The first conductive layer 104 may be formed to a thickness of 200 to 500 angstrom. The hard mask layer 106 is used to maintain the height of a subsequent isolation layer in a chemical mechanical polishing (CMP) process. The hard mask layer 106 may be formed to a thickness of 400 to 500 angstrom using a nitride film. The photoresist pattern 108 is formed to have a pattern by which an isolation region is opened.

Figure 1B:
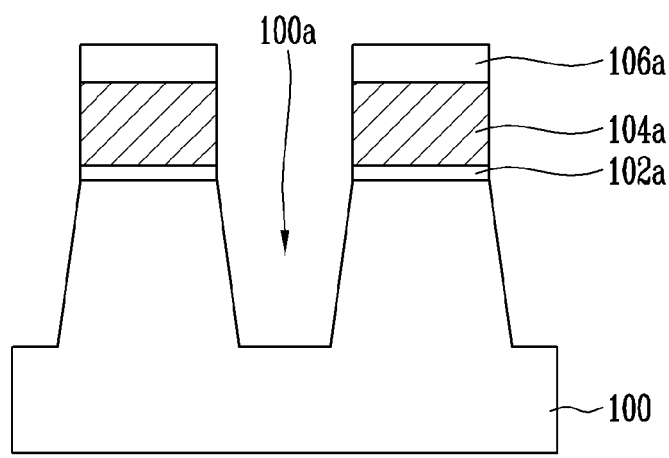

Referring to FIG. 1B, an etch process is performed along the photoresist pattern (refer to 108 of FIG. 1A), thus patterning a hard mask layer 106a, a first conductive layer 104a and a tunnel insulating film 102a. A trench 100a is then formed by etching an exposed portion of the semiconductor substrate 100. The etch process for forming the trench 100a may be performed using a dry etch process which can reduce damage to a laminated film and facilitate pattern formation. After the trench 100a is formed, the photoresist pattern (refer to 108 of FIG. 1A) is removed.

Figure 1C:
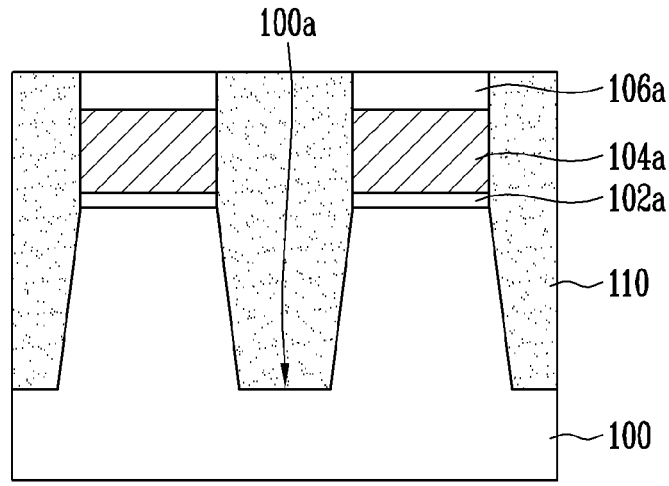

Referring to FIG. 1C, an insulating film is formed over the entire surface, including the semiconductor substrate 100, so that the trench 100a is gap-filled. The insulating film may be formed of an oxide film, and is formed to cover the entire hard mask layer 106a.

A CMP process is then performed so that the insulating film remains only in a region where the trench is formed, thus forming the isolation layer 110, and the entire surface is polished. The CMP process is performed until the hard mask layer 106a is exposed. That is, the polishing process is performed until a top surface of the hard mask layer 106a and a top surface of the insulating film become flat.

Figure 1D:
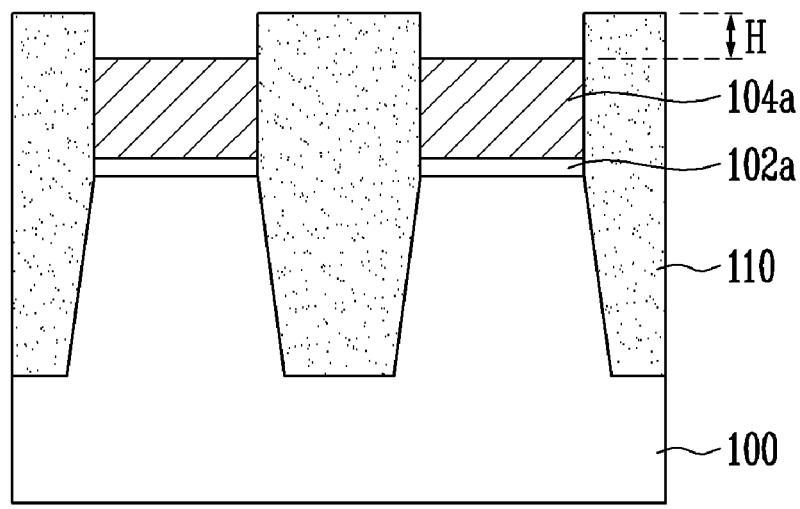

Referring to FIG. 1D, the hard mask layer (refer to 106a of FIG. 1C) is removed by performing an etch process. The etch process is performed under process conditions in which the hard mask layer (refer to 106a of FIG. 1C), rather than the isolation layer 110, is predominantly etched. When the hard mask layer (refer to 106a of FIG. 1C) is a nitride film, it can be removed using a phosphoric acid solution. Accordingly, the hard mask layer (refer to 106a of FIG. 1C) is completely removed, but the isolation layer 110 remains without being etched substantially.

In the etch process, a top surface of the exposed isolation layer 110 may be slightly etched. Thus, it is preferable that the etch process is performed such that a step H between the isolation layer 110 and the first conductive layer 104a becomes 300 to 500 angstrom in height.

Figure 1E:
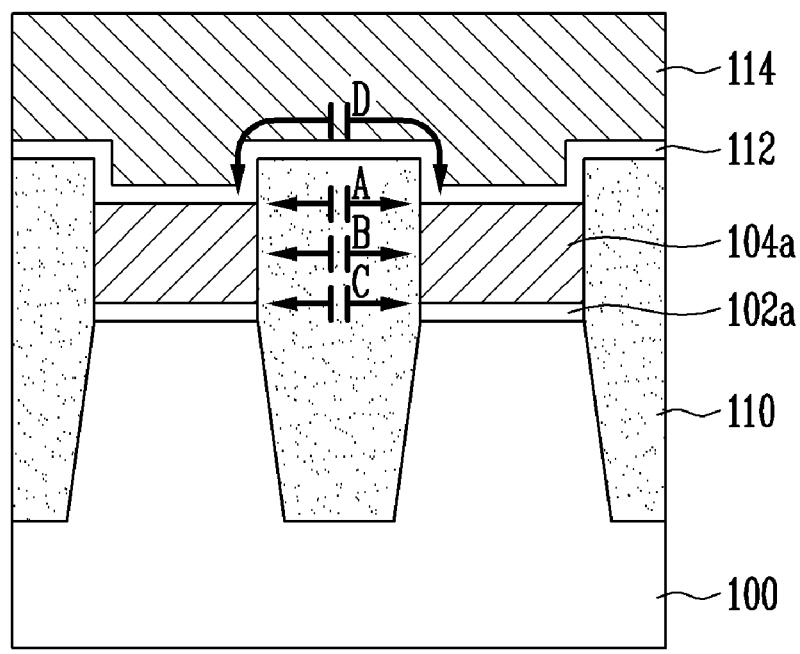

Referring to FIG. 1E, a dielectric layer 112 is formed along the surface of the semiconductor substrate 100 in which the first conductive layer 104a and the isolation layer 110 are formed. The dielectric layer 112 may be formed using a high-k material capable of improving the coupling ratio. The high-k material that can be used as the dielectric layer 112 may include all kinds of high-k materials used in the semiconductor process, such as $Al_2O_3$, $HfO_3$, $ZrO_3$ or combination thereof. The dielectric layer 112 may be formed to a thickness of 100 to 150 angstrom. The high-k material has a dielectric constant higher than that of a general dielectric material and therefore may have great parasitic capacitances (in particular, capacitance D among capacitances A, B, C and D which will be described later in more detail) between the floating gates. In the present invention, however, since the height of the isolation layer 110 is high, the parasitic capacitance (D) value can be reduced. Further, since a high-k material having a high dielectric constant is used, an etch process for EFH control of the isolation layer 110 can be omitted. As semiconductor devices are highly integrated, EFH control becomes difficult, but EFH control of the isolation layer 110 can be omitted by using a high-k material. If EFH control of the isolation layer 110 is omitted, an area facing between the floating gate and the control gate is reduced, but a reduction in the coupling ratio is prohibited since a high-k material is used, therefore, degradation of electrical properties can be prevented.

This is described below in more detail.

In high-integrated flash memory devices, capacitance is parasitically formed by adjacent floating gates and the isolation layer 110 therebetween. Parasitic capacitance forms all in upper (A), intermediate (B) and lower (C) portions of the first conductive layer 104a for the floating gate. Parasitic capacitance values in the respective regions are different from one another.

Assuming that the height of the isolation layer 110 is identical to that of the first conductive layer 104a for the floating gate, the parasitic capacitance formed in the upper portion, the intermediate portion, and the lower portion of the floating gate are defined as a first capacitance A, a second capacitance B, and a third capacitance C, respectively. The first to third capacitances A to C may generate an interference phenomenon between adjacent memory cells, thus becoming a factor to lower reliability of devices. In addition, when the dielectric layer 112 formed of a high-k material is formed over the first conductive layer 104a and the isolation layer 110, the fourth capacitance D comprised of adjacent first conductive layers 104a and the dielectric layer 112 therebetween is formed which may have a great influence on an interference phenomenon between the floating gates.

According to the present invention, the fourth capacitance D can be reduced by forming the isolation layer 110 higher than the floating gate. The reason why the fourth capacitance D is reduced is that the length of the dielectric layers 112 between the first conductive layers 104a is increased since the isolation layer 110 is projected higher than the first conductive layer 104a. Accordingly, the fourth capacitance (D) value generated by the dielectric layer 112 can be reduced thereby reducing an interference phenomenon between the floating gates.

Due to this, interference between adjacent memory cells can be reduced and reliability of devices can be increased. By reducing parasitic capacitance and reducing capacitance between the control gate and the floating gate, the etch process for EFH control of the isolation layer 110 can be omitted.

A second conductive layer 114 for the control gate is formed on the dielectric layer 112 thereafter and a subsequent process is then performed.

In the present invention, the parasitic capacitance between the floating gates is reduced by forming the step H between the isolation layer 110 and the first conductive layer 104a for the floating gate. Accordingly, reliability of devices can be improved.

As described above, according to the present invention, the isolation layer of a flash memory device is projected higher than the top surface of the floating gate. Accordingly, capacitance between neighboring memory cells can be lowered and therefore an interference phenomenon can be reduced.

Further, the dielectric layer formed between the floating gate and the control gate is formed of a high-k material. Accordingly, an EFH control process of the isolation layer can be omitted, the coupling ratio between the floating gate and the control gate can be improved and therefore electrical properties of the device can be improved.

Although the foregoing description has been made with reference to the specific embodiment, it is to be understood that changes and modifications of the present invention may be made by the person skilled in the art without departing from the spirit and scope of the present invention and appended claims.

What is claimed is:

1. A method of fabricating a flash memory device, the method comprising:
   forming a tunnel insulating film, a first conductive layer for a floating gate, and a hard mask layer over a semiconductor substrate;

patterning the hard mask layer, the first conductive layer for the floating gate, the tunnel insulating film, and the semiconductor substrate to form a trench in the semiconductor substrate;

forming an isolation layer so that the trench is gap-filled;

removing the patterned hard mask layer after forming the isolation layer;

forming a dielectric layer directly on a surface of the patterned first conductive layer for the floating gate and the isolation layer, wherein the dielectric layer is formed of a high dielectric constant (high-k) material; and forming a second conductive layer for a control gate on the dielectric layer;

wherein a top surface of the isolation layer after the formation of the second conductive layer is higher than that of the floating gate, wherein the high-k material is formed using any one of $Al_2O_3$, $HfO_3$, $ZrO_3$, and combination thereof.

2. The method of claim 1, wherein the hard mask layer is formed to a thickness of 400 to 500 angstroms.

3. The method of claim 1, wherein the hard mask layer is formed of a nitride film.

4. The method of claim 1, wherein forming the isolation layer comprises:

forming an insulating film for an isolation layer over the trench and the hard mask layer; and performing a polishing process to etch the insulating film until the hard mask layer is exposed.

5. The method of claim 1, wherein a step between the isolation layer and the first conductive layer is in the range of 300 to 500 angstroms.

* * * * *